United States Patent

Hong

[11] Patent Number: 6,069,058
[45] Date of Patent: May 30, 2000

[54] SHALLOW TRENCH ISOLATION FOR SEMICONDUCTOR DEVICES

[75] Inventor: Gary Hong, Hsin-Chu, Taiwan

[73] Assignee: United Semiconductor Corp., Taiwan

[21] Appl. No.: 08/924,432

[22] Filed: Aug. 27, 1997

Related U.S. Application Data

[60] Provisional application No. 60/046,436, May 14, 1997.

[51] Int. Cl.[7] .................................................. H01L 21/76
[52] U.S. Cl. ........................ 438/436; 438/428; 438/434; 438/435; 438/438; 438/561; 438/563
[58] Field of Search ..................................... 438/428, 433, 438/434, 435, 436, 438, 558, 561, 563

[56] References Cited

U.S. PATENT DOCUMENTS

| | | | |
|---|---|---|---|
| 4,571,819 | 2/1986 | Rogers et al. | 438/436 |
| 4,666,557 | 5/1987 | Collins et al. | 438/561 |
| 4,740,480 | 4/1988 | Ooka | 438/436 |
| 4,782,036 | 11/1988 | Becker et al. | 438/563 |
| 4,952,524 | 8/1990 | Lee et al. | 438/437 |
| 5,851,900 | 12/1998 | Chu et al. | 438/434 |

*Primary Examiner*—Trung Dang
*Attorney, Agent, or Firm*—Rabin & Champagne, PC

[57] ABSTRACT

A shallow trench isolation structure is formed by providing a pad layer and a silicon nitride polish stop layer on a surface of a P-type silicon substrate. The silicon nitride polish stop layer and the pad oxide layer are patterned to define openings corresponding to portions of the substrate that will be etched to form trenches. Trenches are defined in the P-type silicon substrate by anisotropic etching. A boron doped oxide or glass is deposited along the walls and floor of the trench. An undoped TEOS oxide is provided over the doped oxide or glass to complete filling of the trench. The device is subjected to a high temperature reflow process, causing the dielectric materials to flow, partially planarizing the device and causing the boron of the first layer to diffuse into the walls and floor of the trench. Chemical mechanical polishing removes excess portions of the dielectric layers. The silicon nitride polish stop layer and the pad oxide layer are removed and conventional processing is performed to complete devices on the substrate. Diffusion of boron into the walls of the trench forms a self-aligned field doping region for the shallow trench isolation structure using relatively few processing steps.

24 Claims, 6 Drawing Sheets

SHALLOW TRENCH ISOLATION FOR SEMICONDUCTOR DEVICES

This application claims priority from provisional application Ser. No. 60/046,436, filed May 14, 1997.

BACKGROUND OF THE INVENTION

1. Field of the Invention

The present invention relates to the provision of isolation structures between devices of an integrated circuit formed in and on a semiconductor substrate and, more particularly, to the formation of shallow trench isolation structures.

2. Description of the Related Art

A variety of integrated circuits incorporate device isolation structures formed between adjacent semiconductor devices to prevent carriers from traveling through the substrate between the adjacent devices. For example, device isolation structures are conventionally formed between adjacent field effect transistors (FETs) in dense semiconductor circuits such as dynamic random access memories (DRAMs) to reduce charge leakage to and from the charge storage nodes of the FETs. Often, device isolation structures take the form of thick field oxide regions extending below the surface of the semiconductor substrate. The most common early technique for forming a field oxide region is the local oxidation of silicon ("LOCOS") technique. The LOCOS technique, including the various modified LOCOS procedures that have been introduced over the years, have provided effective device isolation at a relatively low cost and with an acceptable level of reliability. The LOCOS technique has various drawbacks, however, including its well known problems related to stress generation and the thin "bird's beak" region formed at the periphery of the LOCOS field isolation structure. Particularly because of the bird's beak problem, the LOCOS field isolation structure is difficult to implement effectively for small device geometries and so must be replaced in high density devices by a more readily scaled device isolation structure.

Shallow trench isolation ("STI") has become a prevalent strategy for device isolation. In STI, a sharply defined trench is formed in the semiconductor substrate by anisotropic etching, generally using a silicon nitride hard mask much like the mask used for LOCOS processing. The trench is then filled with oxide to provide a device isolation structure having an upper surface near or at the original substrate surface. FIG. 1 schematically illustrates a small portion of an integrated circuit device incorporating a shallow trench isolation structure. Devices are provided in and on the P-type surface of a silicon substrate 10 which incorporates a shallow trench isolation structure 12 consisting of a trench etched into the surface of the substrate and filled by chemical vapor deposition (CVD) with oxide. A pair of FET devices 14, 16 formed on either side of the STI structure 12 each include a pair of N-type source/drain regions on either side of a channel region in the substrate and a polysilicon gate electrode separated from the channel region by a gate oxide layer. The shallow trench isolation structure separates the closest source/drain regions of the adjacent FET devices 14, 16 to reduce the level of communication between the two FET devices through the substrate. Shallow trench isolation structures provide effective isolation across their entire width and are readily scaled to small device geometries. In this regard, shallow trench isolation structures are unlike LOCOS isolation regions, which must accommodate the bird's beak structures on either side of the LOCOS isolation region and so do not provide device isolation over their entire width. In addition, the techniques typically used to form shallow trench isolation structures naturally produce a substantially planarized surface over the isolation structure. Formation of the shallow trench isolation structure 12 is now discussed in greater detail with reference to FIGS. 2–12.

FIG. 2 illustrates an early stage in the processing of an integrated circuit device including a shallow trench isolation structure. Silicon substrate 10 is coated with a thermal oxide layer 22 that acts as a pad oxide layer to protect the substrate during processing. Pad oxide layer 22 is generally removed before the final gate oxide layer is formed. A layer of silicon nitride 24 is formed by chemical vapor deposition on the pad oxide layer 22 and then a layer of photoresist is deposited, exposed and etched to form an implantation mask 26 on the surface of the silicon nitride layer 24. Ions are typically implanted into the substrate at this stage of the processing to form an electrical isolation device such as an isolation well having a P/N junction along its boundaries. This implantation might alternatively be performed later in the processing, after the planarization of the trench isolation regions shown in FIGS. 6 and 9. The implantation mask 26 is then removed. Next, a trench definition mask 28 as illustrated in FIG. 3 is formed by depositing a layer of photoresist onto silicon nitride layer 24 and then exposing and etching the photoresist layer to form the mask 28. A trench is formed in the substrate by consecutively etching the silicon nitride layer 24, the pad oxide layer 22, and then etching a trench 30 into the silicon substrate 10 (FIG. 4). The trench etching mask 28 is then removed.

Next, the trench 30 is filled with a layer of silicon oxide 32, for example, by atmospheric pressure chemical vapor deposition (APCVD) using tetraethylorthosiloxane (TEOS) as a source gas. The trench is conventionally overfilled during deposition, as shown in FIG. 5, because TEOS oxide typically requires a densification process and the TEOS oxide layer shrinks during densification. Densification of the TEOS oxide is accomplished at a temperature of approximately 1000° C. for a time period of about 10–30 minutes. After densification, the portion of the TEOS oxide layer extending above the silicon nitride layer 24 is removed by chemical mechanical polishing using the silicon nitride layer 24 as a stop for the polishing process, leaving an oxide plug 34 in the trench region (FIG. 6). Although not shown in FIG. 6, the surface of the oxide plug 34 is typically recessed slightly below the surface of the silicon nitride layer 24 during chemical mechanical polishing because the TEOS oxide plug is softer than the silicon nitride layer. The silicon nitride layer 24 is next removed to expose the pad oxide layer 22, typically leaving a portion of the oxide plug 34 extending above the surface of the pad oxide layer 22 (FIG. 7). A hydrofluoric acid dip is used to remove the pad oxide (FIG. 8). A thickness of the TEOS oxide plug 34 greater than the thickness of the pad oxide layer 22 is removed during this etching process because the TEOS oxide plug 34 is etched more rapidly than the thermal oxide of the pad oxide layer 22.

A sacrificial oxide layer 36 is grown once again on the surface of the substrate 10 to protect the substrate surface from damage. One or more implantations, including one or more channel threshold adjust implantations, are performed as required by the device being formed (FIG. 9). The sacrificial oxide layer 36 is then removed, once again using a hydrofluoric acid dip, resulting in the structure schematically illustrated in FIG. 10. Often, the combined actions of the oxide etching steps illustrated in FIGS. 8 and 10 cause a sufficient amount of the plug oxide 34 to be etched so that the surface of the plug oxide is recessed below the surface of the substrate 10. The overetching condition may be most pronounced at the edges of the oxide plug 34 immediately adjacent the surface of the substrate 10, or the entire surface of the oxide plug may be recessed substantially uniformly below the surface of the substrate. In either case, overetching may cause a "shoulder" portion of the substrate 38 to be exposed and partially etched at the side wall of the trench, or only a thin layer of TEOS oxide may cover the substrate adjacent the side wall of the trench.

Referring now to FIG. 11, a gate oxide layer 40 is next grown thermally over the exposed surface of the substrate 10. As a practical matter, the gate oxide layer 40 is of poor quality with a convex profile at the "shoulder" region 38 of the substrate near the trench isolation structure. A polysilicon layer 42 is then deposited over the surface of the substrate by chemical vapor deposition. Polysilicon layer 42 is typically doped by ion implantation and annealing, and then patterned to form a wiring line 44 such as that shown in FIG. 12. Because the wiring line 44 extends over both the gate oxide layer 40 and the surface of the oxide plug 34, the wiring line also extends over the shoulder region 38 near the sidewall of the trench. Thus, the poor quality gate oxide sometimes formed over shoulder regions 38 is sufficiently thin and poor as to allow for parasitic MOSFET action at the shoulder region. The formation of parasitic MOSFETs or other forms of electrical coupling between the wiring line and the substrate can reduce the turn-on threshold voltage of the transistor channel and can produce the abnormal subthreshold current associated with the "kink" effect.

It is accordingly an object of the present invention to provide a shallow trench isolation structure that provides desirable levels of device isolation, as well as improved reliability for the structures and devices formed adjacent to the trench isolation structure.

SUMMARY OF THE PREFERRED EMBODIMENTS

In accordance with a first aspect of the present invention, an integrated circuit device is formed by etching a trench into a substrate which has portions of the substrate adjacent the trench doped to a first conductivity type. The trench is coated with a layer of doped dielectric material and the dopants from the doped dielectric material are diffused into the substrate to form self-aligned doping regions along the walls of the trench. The isolation doping region and the trench together form a device isolation structure for the integrated circuit device.

Another aspect of the invention provides a method of forming an integrated circuit device on a substrate having at least a surface doped to a first conductivity type. A trench definition mask is provided over the substrate and the substrate is etched through the trench definition mask to form a trench in the substrate. A first dielectric layer doped with first dopants is deposited over the substrate and within the trench. A second dielectric layer is deposited over the substrate, the second dielectric layer having a greater flow rate at a predetermined reflow temperature than the first dielectric layer. The first and second dielectric layers are heated to a reflow temperature, dopants from the first dielectric layer diffusing from the first dielectric layer into the substrate through walls of the trench to form self-aligned doping regions along the walls of the trench, wherein the isolation doping regions and the trench both provide device isolation structure for the integrated circuit device.

DETAILED DESCRIPTION OF THE PREFERRED EMBODIMENTS

Preferred embodiments of the present invention form a shallow trench isolation structure in which the inner surface of the shallow trench is doped by diffusion of impurities from an insulating layer deposited over the inner surface of the trench. Most preferably, the doped insulating material is a layer of oxide doped to the same conductivity type as the surface of the substrate. Accordingly, for a P-type silicon substrate, an appropriate insulating layer can be formed by chemical vapor deposition (CVD) of boron silicate glass (BSG). The preferred doped insulator provided on the inner surface of the trench partially fills the trench. Another, undoped insulator is then deposited to complete filling of the trench and to overfill the trench. Diffusion from the preferred doped glass into the substrate to form a field or isolation doping is then accomplished during a high temperature reflow step. The reflow step accomplishes reflow and densification of the doped glass as well as diffusion of dopants from the glass through the inner surface of the trench into the substrate. Most preferably, the doped glass is left in place in the completed shallow trench isolation structure. Practice of preferred aspects of the present invention provide a field dopant over the entire inner surface of the shallow trench which forms an isolation doping self-aligned to the trench. Formation of the doped inner wall of the trench in this manner also provides a surface adjacent the shallow trench isolation structure which is better suited for future device processing. In particular, the upper edges of the trench will be less prone to being exposed during subsequent processing and the surfaces of the substrate adjacent the upper edge of the trench will be less prone to formation of parasitic MOSFET structures.

Figure 1:
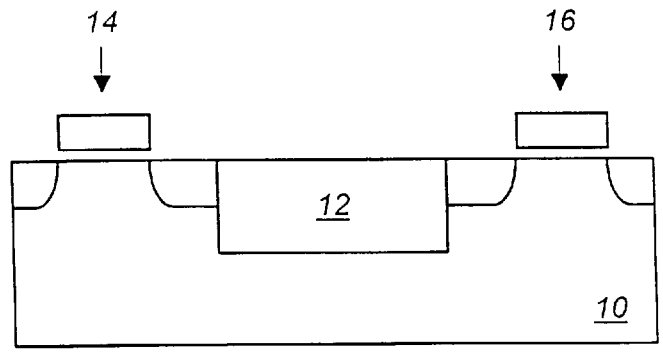
FIG. 1 shows an exemplary integrated circuit device which incorporates a shallow trench isolation structure.
Figure 2:
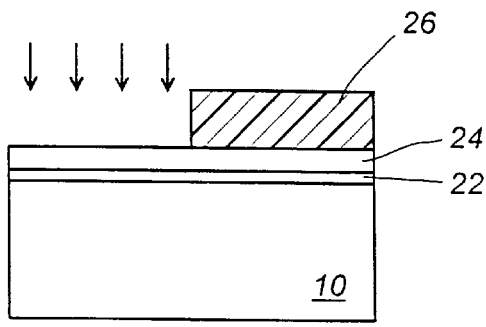
FIGS. 2–12 schematically illustrate processing steps in the conventional formation of a trench isolation structure.
Figure 3:
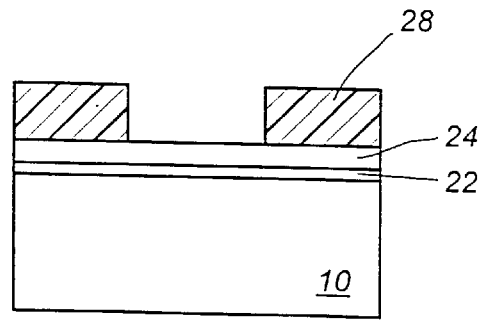
Figure 4:
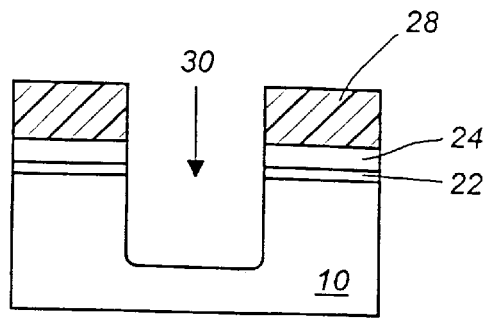
Figure 5:
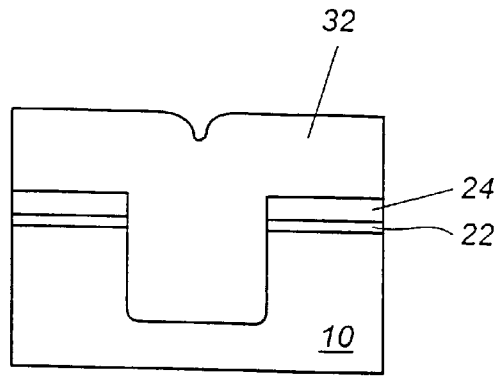
Figure 6:
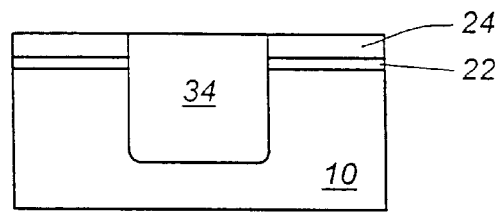
Figure 7:
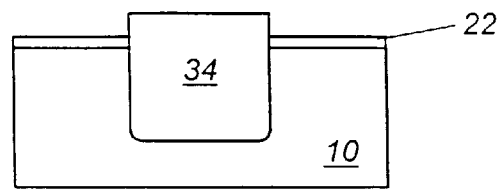
Figure 8:
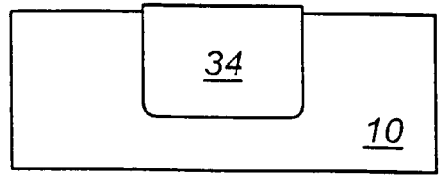
Figure 9:
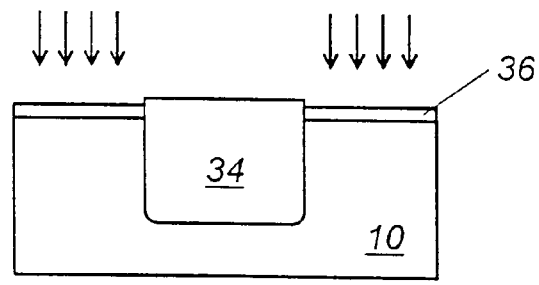
Figure 10:
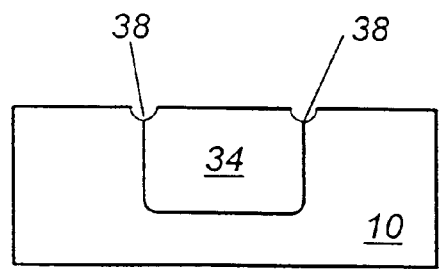
Figure 11:
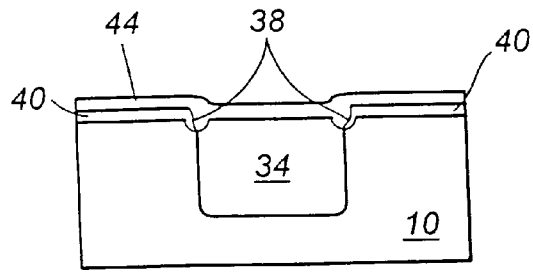
Figure 12:
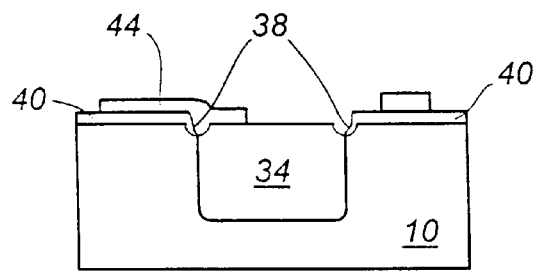
Figure 13:
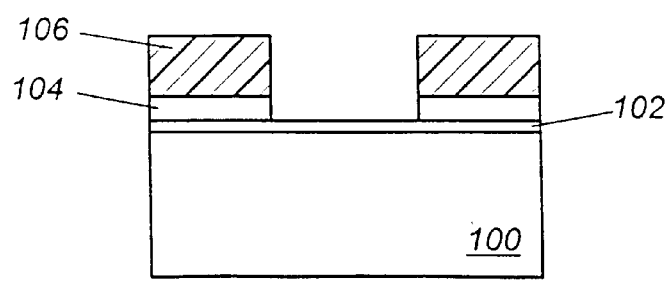
FIGS. 13–18 schematically illustrate processing steps in the formation of a trench isolation structure in accordance with preferred embodiments of the present invention.

Referring to FIG. 13, the process for forming a shallow trench isolation structure in accordance with preferred embodiments of the present invention preferably begins on a silicon substrate 100 having a P-type background doping or having a surface layer doped P-type. A pad oxide layer 102 is formed over the surface of the substrate to protect the substrate during subsequent processing. The pad oxide layer 102 might, for example, be formed by thermal oxidation to a thickness of 50–500 Å. Next, a masking layer 104 is provided over the pad oxide layer 102. The primary function of the masking layer 104 is to serve as a polish stop for a chemical mechanical polishing step performed to define the insulating plug formed within the shallow trench. This masking layer 104 might also be used as a trench definition mask in the anisotropic etching of the silicon substrate used to define the trench. Most often though, the masking layer simply serves as a polish stop. For both purposes, the masking layer 104 may be silicon nitride deposited to a thickness of 800–2000 Å by CVD.

Figure 14:
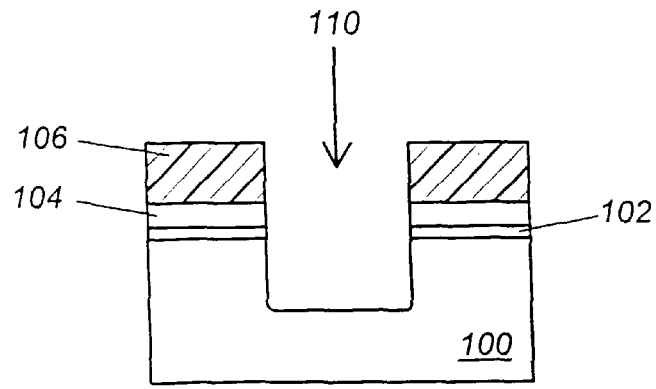

A layer of photoresist is then provided over the masking layer 104 and a photolithography process is used to define the pattern of trenches to be provided for the device. The exposed photoresist is then processed to form the mask 106 shown in FIG. 13. The preferred silicon nitride layer 104 is then etched through the opening 108 in the photoresist mask 106, typically using a dry etching process and a fluorine-based plasma etchant. The etching system might be chosen to have a significant selectivity between nitride and oxide materials, depending on the total thickness of the silicon nitride layer used for the masking layer 104. Using an etching process having a high level of selectivity will allow for a relatively thick silicon nitride layer 104 to be etched in a manner that stops on or near a surface of the silicon oxide pad layer 102. This strategy provides greater process latitude for the step of etching the silicon nitride layer 104. If, on the other hand, a lower selectivity nitride etch process is used, it is preferable to use a thicker pad oxide layer to accommodate nitride overetching. After the nitride layer 104 is etched to expose the pad oxide 102 within the mask opening 108, the pad oxide layer is removed within the mask opening 108 using either a dry oxide etch or a hydrofluoric acid dip. Subsequent to the removal of the nitride layer 104 and oxide layer 102 within the mask opening 108, the substrate is etched as shown in FIG. 14. Typically, the trench 110 is etched into the surface of the silicon substrate to a depth of about 2000–5000 Å using an anisotropic etch process. The trench 110 may be etched using etchants derived from a plasma of HCl and HBr gases. Often, it is preferred to complete the trench etching process using a more isotropic etch so that the lower corners of the trench will be rounded. For example, the trench etch may be completed using an etchant derived from $SF_6$ gas. After the trench etching is complete as shown in FIG. 14, the photoresist mask is removed in a conventional ashing process.

After the trench formation, the silicon nitride layer 104 is preferably left in place and the trench is filled with insulating material in the preferred manner. The preferred trench filling process includes the deposition of a first doped layer of a dielectric material followed by the deposition of a second undoped layer of dielectric material. Most preferably, the first layer deposited is a silicate glass incorporating a dopant of the same conductivity type as the inner surface of the trench and surrounding portions of the surface layer of the substrate. Variations on this process are of course possible, but are typically more complicated and demanding of greater processing resources. As such, they are presently less preferred. For the device illustrated in FIG. 15, it is thus preferred that the first layer of dielectric material be a boron silicate glass (BSG) having a boron concentration of approximately 1–5 percent and having a thickness of between about 200–5000 Å. Layer 112 might alternately be a boron doped oxide layer or another dielectric material having a similar ability to diffuse a preferred dopant into the surface of the trench in a manner described below. In addition, the BSG layer 112 might incorporate other dopants. In such a case, however, it is preferred that only dopants of the appropriate conductivity type be capable of diffusing in significant quantities from the dielectric layer 112 into the surface of the substrate exposed within the trench 110.

Figure 15:
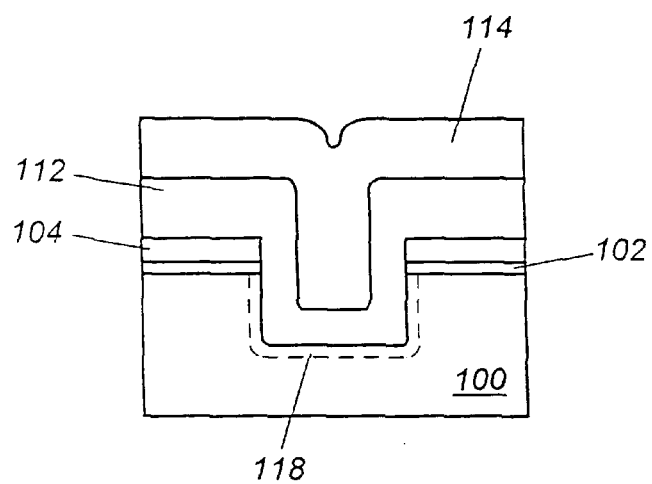

It is possible to completely fill the trench with the doped silicate glass, but it is generally more preferable to only partially fill the trench with the boron silicate glass 112 as shown in FIG. 15 to take advantage of the different reflow properties of doped and undoped silicate glass materials. Most preferably, the second dielectric material deposited over the first dielectric material and within the trench has a high level of reflow or is normally deposited in a manner that provides significant planarization to the device on which it is deposited. Either through a reflow process or through the natural planarization characteristics of the second dielectric layer and its deposition method, it is desirable to achieve a planarized surface for the FIG. 15 device to better accommodate a subsequent CMP or other planarization process. To this end, the second dielectric layer 114 shown in FIG. 15 might be an undoped oxide deposited to a thickness of 1000–5000 Å by CVD from a TEOS source gas.

The FIG. 15 structure, includes a trench filled with a layer of doped dielectric material and a layer of undoped dielectric material, both of which are subjected to a high temperature reflow process that partially planarizes the surface of the device and that causes impurities to out diffuse from the doped silicate glass layer 112 into portions of the substrate in direct contact with layer 112. This may be accomplished, for example, in a furnace at a temperature of approximately 800–1000° C. for a time period of approximately 10–60 minutes. At the end of this process, it is preferred that the surface of the device be substantially planarized. In addition, it is preferred that a dopant of the same conductivity type as the surface of the substrate 100 be diffused from the first dielectric layer 112 into a field doping region 118. Most preferably, the level of doping imparted to the field doping region 118 is sufficient to provide the desired level of device isolation to devices formed on either side of the illustrated trench. As discussed above, isolation for the illustrated structure is accomplished by providing a boron concentration of approximately 1–5 percent within silicate glass layer 112. It is to be appreciated that other device geometries and other dopants might require different doping levels and different diffusion processes.

Figure 16:
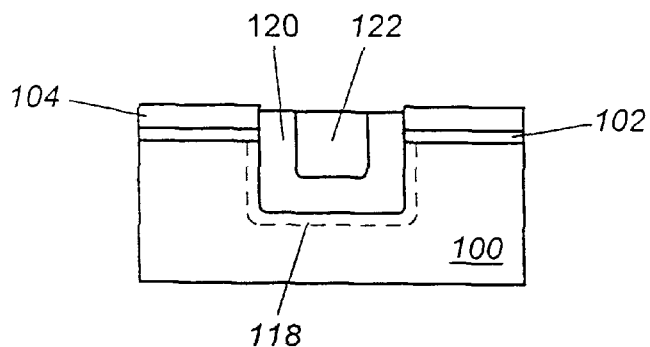

After the trench is filled with dielectric material and the desired isolation doping region 118 is formed, further processing is performed to further define the shape of the dielectric plug that fills the trench. Although this process might be accomplished using dry etching techniques or other etching techniques, presently preferred embodiments of the present invention utilize a chemical mechanical polishing (CMP) process to define the dielectric plug. To this end, the FIG. 15 structure is subjected to CMP using the silicon nitride layer 104 as a polish stop. Thus, in accordance with certain preferred embodiments of the present invention, the dielectric plug will be defined as a layer of BSG 120 lining the trench, with a layer of undoped TEOS oxide 122 occupying the center of the plug (FIG. 16). Ordinarily, the surface of the plug will be recessed below the surface of the silicon nitride masking layer 104 at the end of the polishing process.

The masking layer 104 and the pad oxide layer 102 are then removed from the surface of the substrate 100. For the preferred silicon nitride masking layer 104, a wet etch in a hot phosphoric acid solution can be used to remove the layer 104. The phosphoric acid dip may be followed by a hydrofluoric acid dip to remove the pad oxide layer. During the dip or other etching process used to remove the pad oxide, a further portion of the plug dielectric is removed. Most preferably, the end height of the plug is elevated slightly above the surface of the silicon substrate 100 to avoid exposing the inner edges of the trench to further processing. To accomplish this final structure, it is desirable to select an appropriate thickness for the masking layer 104. When an appropriate thickness of silicon nitride is provided as the masking layer 104, a somewhat predictable recess will be formed in the dielectric plug 120, 122. The subsequent hydrofluoric dip will remove a predictable amount of the dielectric plug. Accordingly, the structure illustrated in FIG. 17 can be achieved with an acceptable level of process uniformity. The end result of the processing described to this point is a shallow trench isolation structure having a trench filled with an insulating dielectric. A self-aligned isolation doping region extends along the sides and the bottom of the trench. Moreover, this structure is produced using comparatively few processing steps and using comparatively well understood and high yield processes.

Figure 17:
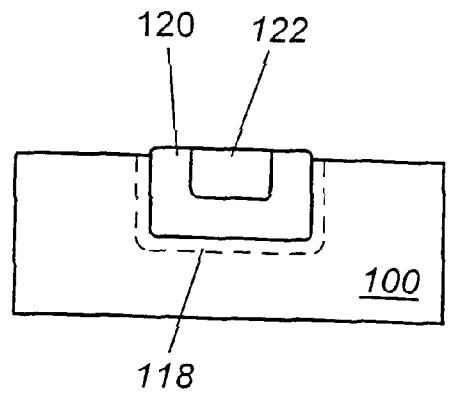
Figure 18:
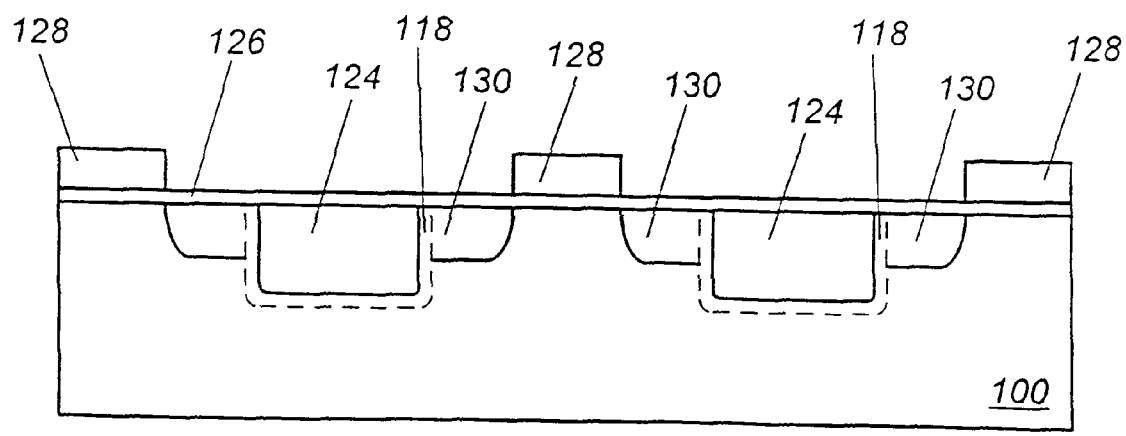

After formation of the shallow trench isolation structure shown in FIG. 17, further processing is performed to form desired devices adjacent to the shallow trench isolation structures. FIG. 18 shows a slightly expanded view of the FIG. 17 isolation structure after further processing provides field effect transistors in and on the substrate. A pair of shallow trench isolation structures incorporating self-aligned field doping regions 118 and dielectric plugs 124 are spaced apart on the surface of the substrate. A gate oxide layer 126 is grown thermally over the active device regions of the substrate defined between the dielectric plugs 124. Doped polysilicon gate electrodes 128 are formed by depositing polysilicon over the device, doping by ion implantation and then patterning the polysilicon layer to form the illustrated electrodes 128. Source/drain regions 130 are then formed by ion implantation self-aligned to the gate electrodes 128 and the dielectric plugs 124 as shown in FIG. 18. As a consequence of the process described, a vertically extending P/N junction is formed between each of the source/drain regions 130 and the self-aligned field doping regions 118 of the adjacent shallow trench isolation structure. The illustrated structure has the advantage not only of providing a high level of device isolation, but also of limiting parasitic transistor action that might occur adjacent the upper edges of the shallow trench. Thus, the illustrated structure should be more immune to the "kink" effect than conventional shallow trench isolation structures.

While the present invention has been described with particular emphasis on certain preferred embodiments of the present invention, those of ordinary skill in the art will appreciate that certain variations and modifications of the embodiments described herein might be made within the general teachings of the present invention. Accordingly, the scope of the present invention is not to be limited to any particular embodiment described herein but is instead to be determined from the scope of the claims, which follow.

What is claimed is:

1. A method of forming an integrated circuit device comprising the steps of:
   providing a substrate having at least a surface doped to a first conductivity type;
   forming a trench definition mask over the substrate;
   etching the substrate through the trench definition mask to form a trench in the substrate;
   providing a first dielectric layer doped with first dopants over the substrate and within the trench;
   providing a second dielectric layer over the substrate, the second dielectric layer having a greater flow rate at a predetermined reflow temperature than the first dielectric layer; and
   heating the first and second dielectric layers to a reflow temperature, dopants from the first dielectric layer diffusing from the first dielectric layer into the substrate through walls of the trench to form self-aligned doping regions along the walls of the trench, wherein the isolation doping regions and the trench both provide device isolation structure for the integrated circuit device.

2. The method of claim 1, further comprising the steps of:
   forming a MOSFET including a gate oxide layer and a gate electrode on the substrate adjacent the trench; and
   implanting impurities into the substrate to form source/drain regions on either side of the gate electrode, at least a first one of the source/drain regions overlapping the isolation doping region.

3. The method of claim 2, wherein the first dopants have the first conductivity type and wherein the source/drain regions are doped to the second conductivity type.

4. The method of claim 3, wherein the first source/drain region and the isolation doping region form a P/N junction extending substantially perpendicular away from the surface of the substrate.

5. The method of claim 1, wherein the first dielectric layer partially fills the trench and the second dielectric layer partially fills the trench.

6. The method of claim 5, wherein the first and second dielectric layers are deposited and wherein the second dielectric layer has a more planar surface than the second dielectric layer after the step of heating.

7. The method of claim 6, wherein the doped dielectric material and the undoped dielectric material each comprise an oxide.

8. The method of claim 1, further comprising the step of polishing to remove portions of the first dielectric layer and portions of the second dielectric layer to define a plug at least partially within the trench.

9. The method of claim 1, wherein a surface of the substrate is covered with a masking layer so that, outside of the trench, first dielectric layer is separated from the substrate by the masking layer.

10. The method of claim 2, wherein the first dielectric layer is a doped silicate glass and the undoped dielectric material is CVD oxide deposited from a TEOS source/gas.

11. The method of claim 9, wherein the masking layer is the trench definition mask.

12. A trench isolation process, comprising:
    etching a trench having walls into a substrate;
    partially filing the trench with a doped dielectric layer having dopants;
    diffusing the dopants from the doped dielectric layer into the substrate, thereby forming a self-aligned isolation doping region along the walls of the trench;
    forming an undoped silicon oxide dielectric layer over the doped dielectric layer; and
    annealing the undoped silicon oxide dielectric layer and the doped dielectric layer to reflow at least the undoped silicon oxide dielectric layer.

13. The process of claim 12, further comprising the step of polishing to remove portions of the undoped silicon oxide dielectric layer and portions of the doped dielectric layer to define a plug at least partially within the trench.

14. The process of claim 13, wherein a surface of the substrate is covered with a polish stop layer so that, outside of the trench, the doped dielectric layer is separated from the substrate by the polish stop layer.

15. The process of claim 14, wherein the step of polishing is terminated on the polish stop layer.

16. The process of claim 15, further comprising the step of stripping the polish stop layer.

17. A trench isolation process, comprising:
    etching a trench into a substrate, the trench having a horizontal surface and substantially vertical sidewalls;
    coating the trench with a layer of doped dielectric material doped with dopants, wherein the layer of doped dielectric material partially fills the trench;
    diffusing the dopants from the layer of doped dielectric material into the substrate, thereby forming a self-aligned isolation doping region along the horizontal surface and the vertical sidewalls of the trench; and providing a layer of undoped dielectric material over the layer of doped dielectric material.

18. The process of claim 17, wherein the layer of undoped dielectric material has a more planar surface than the layer of doped dielectric material.

19. The process of claim 17, wherein the doped dielectric material and the undoped dielectric material each comprises an oxide.

20. The process of claim 19, wherein the layer of doped dielectric material is a doped silicate glass and the undoped dielectric material is CVD oxide deposited from a TEOS source/gas.

21. The process of claim 17, wherein the layer of doped dielectric material is boron silicate glass.

22. The process of claim 17, further comprising the steps of:

forming a MOSFET including a gate oxide layer and a gate electrode on the substrate adjacent the trench; and implanting impurities into the substrate to form source/drain regions on either side of the gate electrode, at least a first one of the source/drain regions overlapping the isolation doping region.

23. The process of claim 22, wherein the dopants have a first conductivity type and wherein the impurities have a second conductivity type.

24. The process of claim 23, wherein the first one of the source/drain regions and the isolation doping region form a P/N junction extending substantially perpendicular to the surface of the substrate.

* * * * *